United States Patent [19]

Sonobe et al.

[11] Patent Number: 5,138,365
[45] Date of Patent: Aug. 11, 1992

[54] IMAGE RECORDING APPARATUS WHICH DISCHARGES AN OUTPUT IMAGE SHEET UPON COMPLETION OF PHOTOSENSITIVE RECORDING MEDIUM ADJUSTMENT

[75] Inventors: Katsuyoshi Sonobe; Hiroaki Kimura, both of Nagoya, Japan

[73] Assignee: Brother Kogyo Kabushiki Kaisha, Japan

[21] Appl. No.: 595,411

[22] Filed: Oct. 11, 1990

[30] Foreign Application Priority Data

Oct. 16, 1989 [JP] Japan .................................. 1-269737

[51] Int. Cl.$^5$ ............................................ G03B 27/32
[52] U.S. Cl. ................................................ 355/27; 355/72
[58] Field of Search ............................ 355/27, 28, 72; 354/173.1, 173.11; 430/138

[56] References Cited

U.S. PATENT DOCUMENTS

| | | | |
|---|---|---|---|
| 4,801,976 | 1/1989 | Hayashi | 355/28 |
| 4,901,103 | 2/1990 | Hayakawa et al. | 355/27 |
| 4,903,070 | 2/1990 | Nakata et al. | 355/27 |
| 4,935,769 | 6/1990 | Ogura | 355/27 |
| 5,017,958 | 5/1991 | Katoh | 355/27 |
| 5,041,863 | 8/1991 | Kobayashi et al. | 355/27 |

Primary Examiner—L. T. Hix
Assistant Examiner—Khanh Dang
Attorney, Agent, or Firm—Oliff & Berridge

[57] ABSTRACT

An image recording apparatus records an image on an elongated continuous form photosensitive recording medium capable of receiving a latent image of an output image to be formed, and a cut sheet type of a developer recording medium provides an output image upon reaction with the latent image on the photosensitive recording medium. The recording apparatus includes an exposure portion for exposing the elongated continuous form photosensitive recording medium fed along the recording medium feeding path to a light image to form the latent image thereon. The exposure portion includes an exposure position whereat a leading edge of an unexposed portion of the photosensitive recording medium is located prior to imaging. A developing portion is disposed downstream of the exposing portion with respect to the recording medium feeding path and develops the exposed photosensitive recording medium superposed with the developer recording medium. A separating portion is disposed downstream of the developing portion with respect to the recording medium feeding path and separates the exposed photosensitive recording medium from the developer recording medium. A controlling portion controls a developer feeding portion and a photosensitive recording medium feeding portion so that the time required to feed a trailing edge of the developer recording medium from a position downstream of the separating portion to a discharged position is at least as long as the time required to feed a leading edge of an unexposed portion of the photosensitive recording medium from a position downstream of the separating portion back to the exposure position.

12 Claims, 4 Drawing Sheets ic recording medium is located prior to being exposed to the light image; developing means, disposed downstream of said exposing means with respect to said recording medium

IMAGE RECORDING APPARATUS WHICH DISCHARGES AN OUTPUT IMAGE SHEET UPON COMPLETION OF PHOTOSENSITIVE RECORDING MEDIUM ADJUSTMENT

Cross-reference is made to the following copending applications of the same assignee which are filed concurrently herewith and disclose the same basic image recording system: U.S. patent application Ser. No. 07/595,405 filed Oct. 11, 1990 to Katsuyoshi Sonore and entitled "Image Recording Apparatus For Inhibiting the Deterioration of Photosensitive Recording Medium"; U.S. Pat. No. 5,041,863 to Masanori Kobayashi et al and entitled "Image Recording Apparatus Which Prohibits Starting of a Recording Operation Until Completion of Photosensitive Recording Medium Adjustment; and U.S. patent application No. 07/595,850 filed Oct. 11, 1990 to Shin Asai and entitled "Image Recording Apparatus Which Reduces The Wasting of Photosensitive Recording Medium When Operating In a Plural Image Recording Mode". The above-listed applications are herein incorporated by reference.

BACKGROUND OF THE INVENTION

1. Field of the Invention

The present invention relates to an image recording apparatus such as a copying machine or a printer, and more particularly to such an image recording apparatus that employs a photosensitive recording medium which is used to form an output image sheet.

2. Discussion of the Related Art

Generally, an image recording apparatus which uses a photosensitive recording medium employs, for instance, as disclosed in U.S. Pat. No. 4,903,070, the disclosure of which is herein incorporated by reference, an elongated web-like microcapsule sheet coated with a plurality of photo and pressure sensitive microcapsules, each microcapsule enveloping therein a chromogenic material and a photosensitive resin, and a developer sheet coated with developing material which produces an output image upon reaction with the chromogenic material, as is well known in the art.

The image recording apparatus comprises means for receiving the elongated web-like microcapsule sheet wound around a cartridge shaft and retained in a cartridge, an exposing unit for exposing the microcapsule sheet disposed at an exposure table to form a latent image thereon, a developer sheet feeding unit for feeding a developer sheet from a developer sheet cassette, which stores therein, for example, a stack of developer sheets toward an exposed microcapsule sheet, a pressure developing unit for pressurizing the exposed microcapsule sheet superposed with the developer sheet to thereby form an output image on the developer sheet, a separating unit for separating the exposed microcapsule sheet from the developer sheet, a taking-up unit for taking-up the separated microcapsule sheet, and a thermal fixing unit for fixing the output image on the developer sheet.

In this type of image recording apparatus, the elongated microcapsule sheet drawn out of the cartridge passes through the exposing unit, the pressure developing unit and the separating unit, and is taken up by a taking-up unit. The developer sheet and superposed elongated microcapsule sheet containing a latent image are pressurized by the pressure developing unit, and are separated from each other by the separating unit and then the developer sheet is subjected to thermal fixing in the thermal fixing unit. At this time, the copying operation is completed.

However, upon completion of the above copying operation, the leading edge of the unexposed area of the microcapsule sheet has passed through the pressure developing unit. If the next copying operation is immediately performed in the above mentioned situation, an unexposed portion of the microcapsule sheet, located between the trailing edge of the exposed area from the preceding copying operation (now located near the separating unit) and the leading edge of the next exposing area for the next copying operation (now located near the exposing unit), is not fully utilized, resulting in waste of photosensitive recording medium.

In order to prevent waste of the photosensitive recording sheet, U.S. Pat. No. 4,801,976, the disclosure of which is herein incorporated by reference, discloses a copying machine for copying an image on a photo-pressure sensitive recording sheet, which comprises an exposing unit for exposing a photo-pressure sensitive sheet placed at an exposure position to form a latent image thereon, a magnification detection unit for detecting the degree of magnification of said image exposed by said exposing unit, and an exposure area controlling unit for controlling a feeding unit in response to said detection unit, whereby said photo-pressure sensitive sheet is exposed by said exposing unit from a leading edge thereof.

However, in the conventional copying machine, the leading edge of the photo-pressure sensitive recording sheet is controlled so as to be located at the proper exposure position after the developer sheet having a desired image thereon has been discharged out of the copying machine. For the above mentioned reason, a user must wait a time period for the proper positioning of the leading edge of the unexposed photo-pressure sensitive recording sheet to the exposure position, after which time period he then proceeds with the next copying operation.

OBJECTS AND SUMMARY OF THE INVENTION

It is therefore an object of the present invention to overcome the above-described drawbacks and disadvantages, and to provide an image recording apparatus with which a user can record an image on a photosensitive recording medium without waiting for the proper positioning of the leading edge of the photosensitive recording medium to the exposure position before he can proceed with the next recording operation and without wasting any of the photosensitive recording medium.

To attain this and other objects, according to the present invention, there is provided an image recording apparatus for recording an image on a recording medium, said apparatus having a recording medium feeding path and comprising: means for receiving a cartridge of a continuous form photosensitive recording medium; exposing means for exposing the elongated continuous form photosensitive recording medium located along said recording medium feeding path to form an image thereon, said exposing means having an exposure position at which a leading edge of a portion of said photosensitive recording medium to be exposed to a light image is located prior to being exposed to the light image; developing means, disposed downstream of said exposing means with respect to said recording medium feeding path, for developing an exposed portion of the photosensitive recording medium to form an output image sheet; separating means, disposed downstream of said developing means with respect to said recording medium feeding path, for separating the output image sheet from the photosensitive recording medium; means for feeding the output image sheet from a position downstream of said separating means to a discharged position along said recording medium feeding path; a photosensitive recording medium feeding means for feeding said photosensitive recording medium from a position downstream of said separating means to the exposure position through the developing means along said recording medium feeding path; and controlling means for controlling said means for feeding said output image sheet and said photosensitive recording medium feeding means so that the time of feeding of an output image sheet from said position downstream of said separating means to said discharged position along said recording medium feeding path is not shorter than the time of feeding of said photosensitive recording medium from said position downstream of said separating means to the exposure position through the developing means along said recording medium feeding path.

In the above-described image recording apparatus of the present invention, an image recording apparatus can employ an elongated continuous form photosensitive recording medium capable of receiving a latent image of an output image to be formed, and a cut sheet type of a developer recording medium which provides an output image sheet upon reaction with the latent image on the photosensitive recording medium. An exposing means exposes the elongated continuous form photosensitive recording medium as it is fed along said recording medium feeding path while located at an exposure position, to form a latent image thereon. A developing means, disposed downstream of said exposing means with respect to said recording medium feeding path, develops the exposed photosensitive recording medium while it is superposed with a sheet of the developer recording medium to form the output image sheet. A separating means, disposed downstream of said developing means with respect to said recording medium feeding path, separates the exposed photosensitive recording medium from the developer recording medium.

The image recording apparatus can further comprise developer recording medium feeding means for feeding a sheet of the developer recording medium from a stored position to a discharged position through the developing means and the separating means along a developer recording medium feeding path, a photosensitive recording medium feeding means that feeds said photosensitive recording medium from a position adjacent to the separating means to the exposure position through the developing means along a photosensitive recording medium feeding path, and a controlling means for controlling said developer feeding means and said photosensitive recording medium feeding means so that the time required to feed a sheet of the developer recording medium from a position adjacent said separating means to the discharged position along said developer recording medium feeding path is not shorter than (i.e., is equal to or greater than) the time required to feed the photosensitive recording medium from a position adjacent said separating means to the exposure position through the developing means along said photosensitive recording medium feeding path.

As a result, a developer recording medium is not located in the discharged position after being conveyed from a position adjacent the separating means along said developer recording medium feeding path by the developer recording medium feeding means until the leading edge of an unexposed portion of the photosensitive recording medium is located at the proper exposure position after being conveyed from a position adjacent the separating means to the exposure position through the developing means along the photosensitive recording medium feeding path by a photosensitive recording medium feeding means. Thus, a user does not need to wait for the positioning of the leading edge of the unexposed portion of the photosensitive recording medium to the exposure position after he recognizes the end of the preceding recording operation by viewing a sheet of the developer recording medium having a desired image disposed thereon exiting at the discharged position. Instead, he is able to perform the next recording operation when he views a sheet of the developer recording medium having a desired image disposed thereon exiting at the discharged position because the leading edge of the unexposed portion of the photosensitive recording medium is in the exposure position ready to receive the next image at this time.

The present invention is also applicable to machines which use the single sheet type of recording medium such as shown in the above-incorporated U.S. Pat. No. 4,801,976.

BRIEF DESCRIPTION OF THE DRAWINGS

The foregoing and other objects, features and advantages of the present invention will become more apparent by reading the following detailed description of a presently preferred embodiment of the invention, when considered in connection with the accompanying drawings, in which.

F G. 3 is a schematic elevational view in cross section of a cartridge and a feeding mechanism of the photosensitive pressure sensitive recording sheet.

DETAILED DESCRIPTION OF THE PREFERRED EMBODIMENTS

Figure 1:
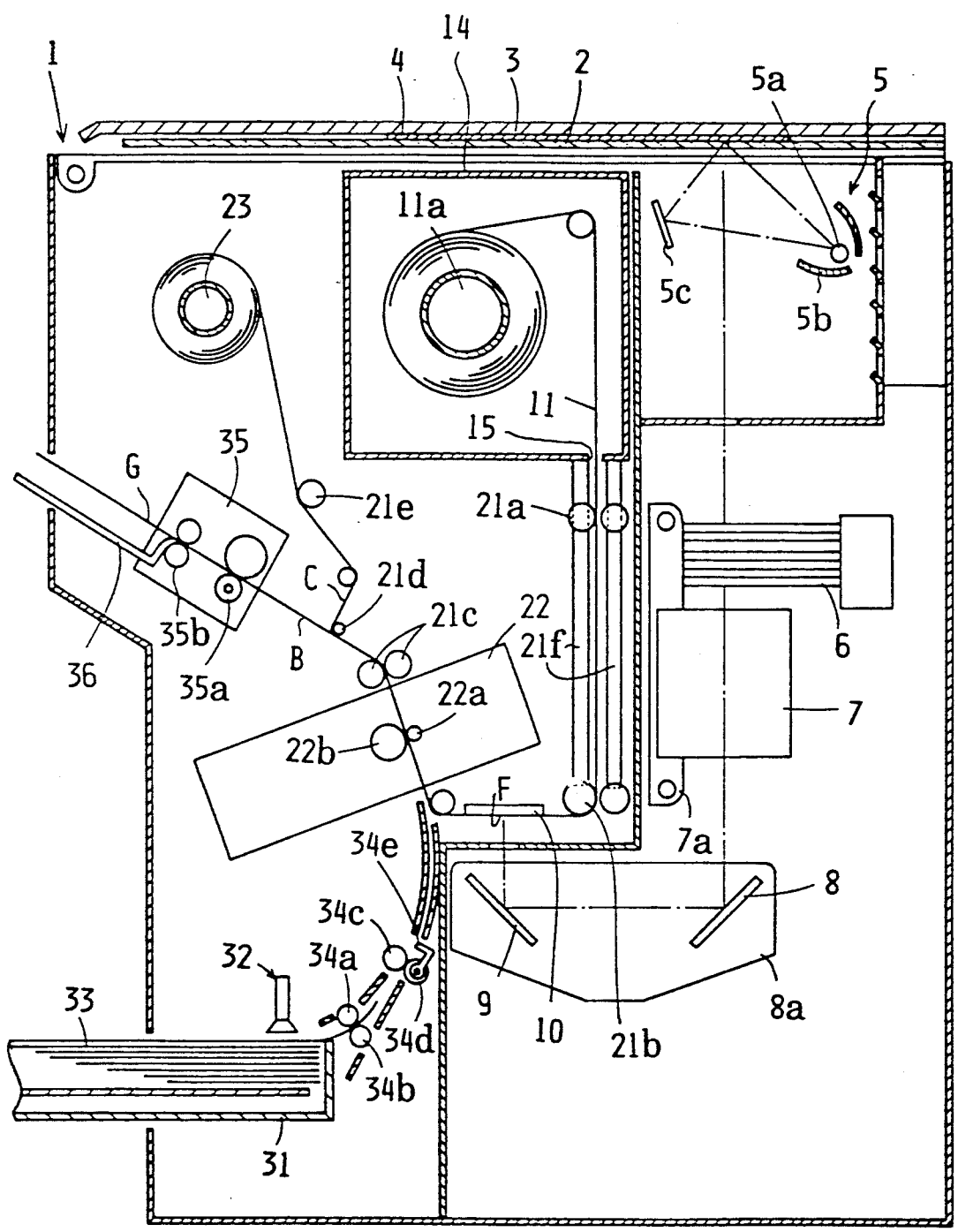
FIG. 1 is a schematic elevational view in cross section of one embodiment of an image recording apparatus of the present invention.

One embodiment according to the present invention is shown in FIGS. 1-4. FIG. 1 schematically shows a copying machine according to an embodiment of the disclosed invention. The illustrated copying machine, generally indicated at 1, is a photosensitive pressure-sensitive copying machine capable of copying and producing full-color images.

The photosensitive recording medium is of a transfer type recording medium which comprises a photosensitive recording medium and a developer recording medium. More specifically, the photosensitive recording medium comprises a photosensitive pressure sensitive recording medium provided with microcapsules which encapsulate therein a first material (chromogenic material or dye precursor) having first and second phases dependent on light exposure. The developer recording medium comprises the developer recording sheet coated on a substrate with a second material (developer material) which provides an output image upon reaction with the first material. Such an image recording medium is disclosed in, for example, U.S. Pat. No. 4,399,209 and Japanese Patent Application Kokai No. 58-88739.

The copying machine employs a continuous photosensitive pressure-sensitive recording sheet such as a microcapsule sheet 11 for recording a latent image thereon, and a developer sheet 33 for receiving a developed color image from the microcapsule sheet 11.

The copying machine 1 includes an upper panel assembly having an original support stand glass 2 which is movable back and forth and an original support stand glass cover 3 that can be placed over the original support stand glass 2. An original 4 to be copied is put on the original support stand glass 2, which is formed of light transmissive material. The copying machine 1 also has a light source 5 placed in an upper righthand portion thereof below the original support stand glass 2 and includes a halogen lamp 5a extending in a direction normal to the direction in which the original support stand glass 2 is movable back and forth, and a semicylindrical reflecting mirror 5b disposed in surrounding relation to the halogen lamp 5a. The light source 5 emits a linear-line of light toward the lower surface of the original support stand glass 2.

When the original support glass 2 moves, the light emitted from the halogen lamp 5a sequentially irradiates the entire surface of the original support stand glass 2 from the lefthand to the righthand end thereof (as viewed in FIG. 1). The light from the light source 5 passes through the transparent original support stand glass 2, and is then reflected by the original 4 placed on the original support stand glass 2. The original support stand glass cover 3 covers the entire upper surface of the original support stand glass 2 so that the light applied to the original support stand glass 2 will not leak out from those areas of the original support stand glass 2 which are not covered by the original.

A reflector 5c is positioned on the lefthand side of the light source 5 for applying light emitted from halogen lamp 5a to the original in a highly efficient manner. The reflector 5b reflects light emitted from lamp 5a which is not initially directed toward the original support glass 2.

The light reflected from the original 4 on the original support stand glass 2 is directed downwardly and passes through a filter 6 and a lens 7. The filter 6 serves to pass desired wavelengths of light dependent on the sensitivity of a microcapsule sheet 11 for adjusting the colors of a copied image. The lens 7 is mounted on a lens attachment 7a which is slightly adjustable with respect to the path of the light through the filter 6 and the lens 7.

The light converged by the lens 7 is directed 180 degrees by two reflecting mirror 8, 9 and then focused on the microcapsule sheet 11 held closely against the lower surface of an exposure table 10. The reflecting mirrors 8, 9 are mounted on a mirror attachment 8a which is slightly positionally adjustable to vary the length of the light path for focusing.

The microcapsule sheet 11 is of a continuously elongated length and is wound around a cartridge reel 11a, and the wound microcapsule sheet 11 is placed in the removable cartridge 14 positioned below the original support stand glass 2. A leading end portion of the microcapsule sheet 11 which is provided with a leader consisting of a suitable sheet fixed to the leading edge of the photosensitive material extends through many rollers 21a, 21b, 21c, a pressure developing unit 22, and a separator roller 21d toward a take up reel 23 described below. The photosensitive sheet roll is accommodated in cartridge 14 such that the leader may be fed outside the cartridge 14 casing through a delivery slot 15, as illustrated in FIG. 1.

As shown in FIG. 1 the microcapsule sheet 11 which has been drawn out of the cartridge 14 is fed and guided by a feed roller 21a and a guide roller 21b, and extends beneath exposure table 10 into the pressure developing unit 22. The microcapsule sheet 11 which has passed through the pressure developing unit 22 is fed by a pair of feed rollers 21c, travels past a separator roller 21d and an adjustment roller 21e, and is then wound around the take-up reel 23. The microcapsule sheet 11 discharged from cartridge 14 is prevented from being prematurely exposed by a light-shielding cover 21f prior to reaching exposure table 10.

The speed at which the microcapsule sheet 11 is fed in an exposing operation is controlled so as to be held at a constant level, and remains the same speed at which the original support stand glass 2 is moved. Therefore, a latent image can be formed successively line by line on the microcapsule sheet 11, when it moves past the exposure table 10.

A developer sheet cassette 31 storing a stack of developer sheets 33 is disposed below the pressure developing unit 22. The developer sheets 33 are taken out of cassette 31 one at a time by a sheet feed mechanism 32 which attracts the developer sheets 33 with suction. Each developer sheet 33 which is taken from the cassette 31 is conveyed further by a feed roller 34a and a pinch roller 34b. After the leading end of the developer sheet 33 is aligned by rollers 34c, 34d and a resist gate 34e, the developer sheet 33 is fed into an inlet slot of the pressure developing unit 22.

The microcapsule sheet 11 and the developer sheet 33 are closely held against each other when they are introduced into the pressure developing unit 22. The pressure developing unit 22 includes a small diameter roller 22a and a backup roller 22b. The microcapsule sheet 11 and the developer sheet 33 are sandwiched and pressed together between the small diameter roller 22a and the backup roller 22b. At this time, the microcapsule layer on the microcapsule sheet 11 with the latent image formed thereon and the color developer layer on the developer sheet 33 are held against each other. Those microcapsules in the microcapsule layer which are not exposed are ruptured under pressure, and a developed image is transferred onto the developer sheet 33.

The small diameter roller 22a and the backup roller 22b in the pressure developing unit 22 are also movable to a position where they are spaced apart from each other so that they do not sandwich and pressurize the microcapsule sheet 11 and the developer sheet 33 when located therebetween. It is understood that the pressure rollers 22a and 22b do not necessarily have to be moved apart. For example, if the normal operating position of rollers 22a and 22b is such that they are spaced apart from each other by a distance which is slightly greater than the thickness of the photosensitive sheet, yet less than the combined thickness of the photosensitive sheet and the developer sheet, rollers 22a and 22b do not need to be separated any further. See, for example, U.S. Pat. No. 4,901,103.

Developing unit 22 functions as developing means for developing the exposed photosensitive recording medium superposed with the developer recording medium.

The microcapsule sheet 11 and the developer sheet 33 which have left the pressure developing unit 22 are fed by rollers 21c. Then, the microcapsule sheet 11 is separated from the developer sheet 33 by the separator roller 21d. The microcapsule sheet 11 is directed upwardly, whereas the developer sheet 33 travels straight ahead into a thermal fixing unit 35. Thus, at least separator portion 21d functions as means for separating the exposed photosensitive recording medium from the developer recording medium. The thermal fixing unit 35 includes a heater roller 35a and a feed roller 35b. After color development on the developer sheet 33 is promoted and the color image is fixed by the heat fixing unit 35, the developer sheet 33 is discharged into a tray 36 with the developed image facing up. The separated microcapsule sheet 11 travels past the adjustment roller 21e and is wound around the take-up reel 23.

The roller 21a is provided with a rotating plate 25c (not shown in FIG. 1 but shown in FIG. 2) located in encoder 25 to detect the speed of the feeding of the microcapsule sheet 11 described in detail below.

Figure 2:
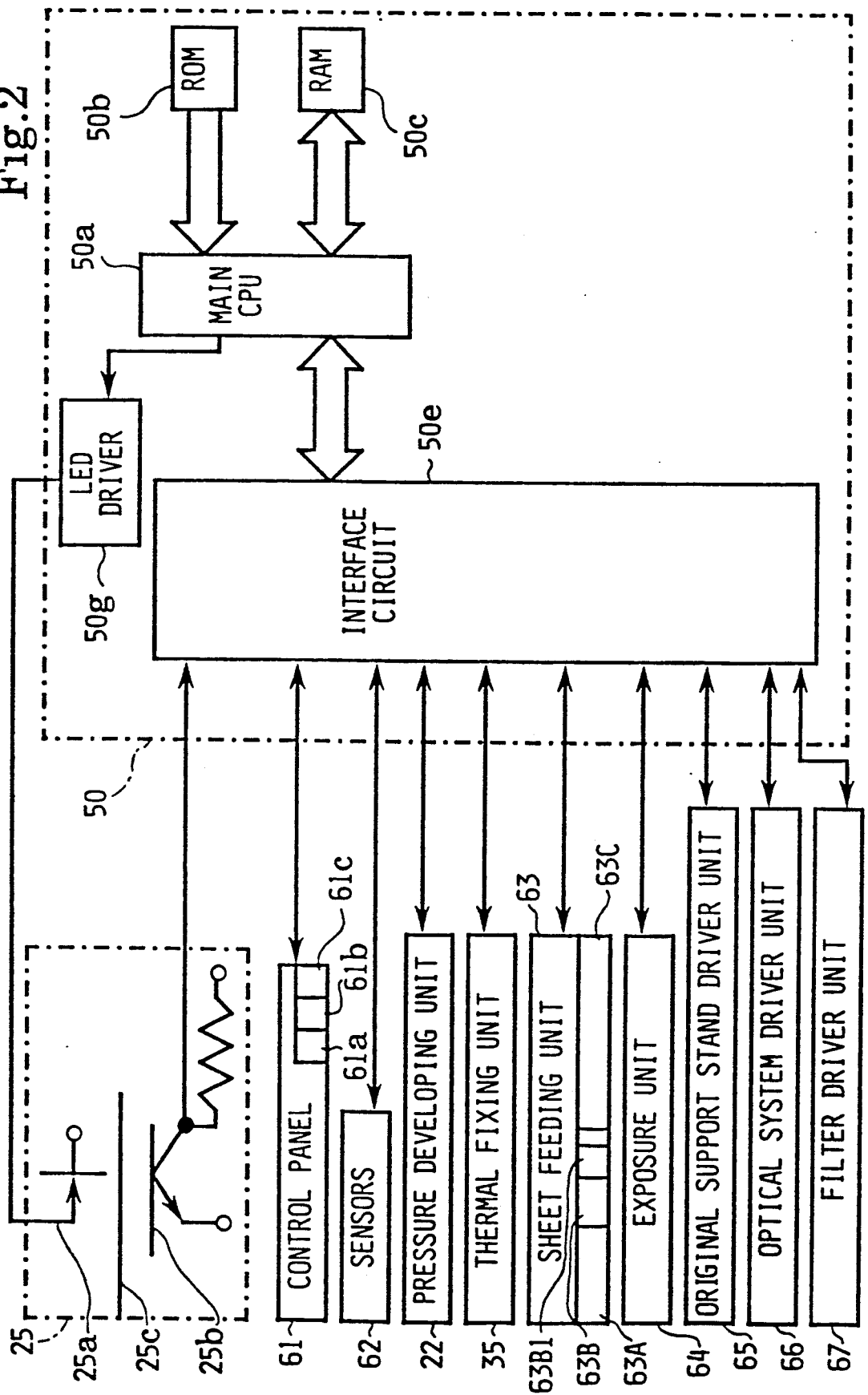
FIG. 2 is a block diagram showing a controller which includes an electrical control circuit.
Figure 3:
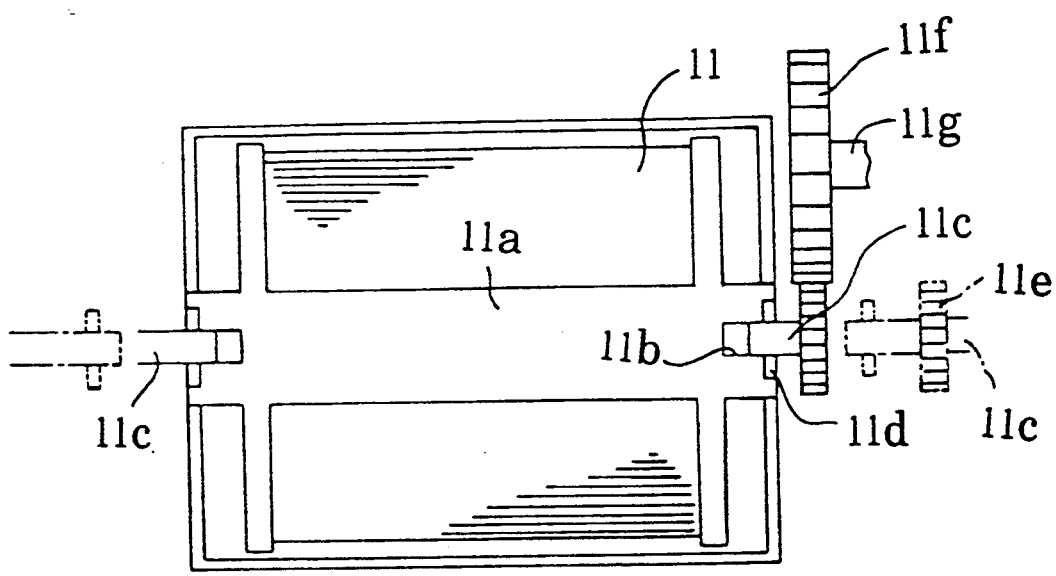

As shown in FIG. 3, microcapsule sheet 11 is wound around a cartridge reel 11a in cartridge 14. The cartridge reel 11a has a pair of grooves 11b at both sides thereof to engage with the cartridge support shafts 11c provided in the present machine 1. The cartridge support shafts 11c are constructed for movement back and forth toward and away from the pair of grooves 11b when the cartridge 14 is placed in or removed from machine 1. A pair of cartridge support shafts 11c have a pair of convex portions 11d which rotate the cartridge reel 11a when the pair of grooves 11b in the cartridge reel 11a are engaged by the convex portions 11d of the cartridge support shafts 11c. A transmitting gear 11e is provided on one of the cartridge support shafts 11c and is attached thereto for rotation with this cartridge support shaft 11c. A driving gear 11f, disposed near gear 11e is connected with a driving source 63B1 (not shown in FIG. 3 but shown in FIG. 2) through driving shaft 11g, and is engageable with gear 11e. In this case, when the cartridge support shafts 11c are moved into the pair of grooves 11b and the pair of grooves 11b are engaged with the convex portions 11d, the cartridge reel 11a receives the driving force from driving source 63B1 through the driving gear 11f, the gear 11e, and the cartridge support shaft 11c.

Accordingly, when a cartridge 14 is placed in machine 1, and the cartridge shaft 11a is engaged with the pair of cartridge support shafts 11c, the cartridge shaft 11a is rotated clockwise or counterclockwise by the driving source 63B1 through the driving shaft 11g, the driving gear 11f, the gear 11e, and the convex portions 11d so as to roll-up or unroll the microcapsule sheet 11 from around the cartridge reel 11a.

There will next be described an arrangement of the controller 50 in the instant apparatus 1 by reference to the block diagram of FIG. 2. The controller 50 includes an interface circuit 50e, and a main CPU (central processing unit) 50a, to which are connected through the interface circuit 50e, the encoder 25, a control panel 61, sensors 62, the pressure developing unit 22, the thermal fixing unit 35, a sheet feeding unit 63, an exposure unit 64, an original support stand driver unit 65, an optical system driver unit 66 and a filter driver unit 67.

The encoder 25 includes a rotating plate 25c having many slits disposed along a circumference thereof, a light-emitting element 25a for producing and directing a light beam toward the rotating plate 25c, and a light-sensitive element 25b for receiving the light beam transmitted through slits of the rotating plate 25c, whereby the encoder 25 generates a pulse signal corresponding to the rotation of the rotating plate 25c based on the output of light-sensitive element 25b. The main CPU 50a is also connected to the encoder 25 to receive the output of the encoder 25 through the interface circuit 50e, and the light-emitting element 25a is connected to the main CPU 50a in the controller 50 through a light-emitting element driver 50g. CPU 50a is adapted to count the number of pulses received from encoder 25 and to determine the amount and direction of the rotation of feeding roller 21a based on the received pulse signals.

A control panel 61 has a start key 61a, an error lamp 61b and other input keys 61c. Sensors 62 are disposed in the apparatus 1 to transmit signals to CPU 50a to control the apparatus. Sheet feeding unit 63 has a developer sheet feeding portion 63A for feeding of the developer sheet 33, and a microcapsule sheet feeding portion 63B, for feeding the microcapsule sheet 11 and includes the driving source 63B1, and a separator roller driving portion 63C. Developer sheet portion 63A functions as developer recording medium feeding means for feeding developer sheet 33 from cassette 31 to tray 36. Microcapsule sheet feeding portion 63B functions as, among other things, photosensitive recording medium feeding means for feeding the microcapsule sheet 11 (the photosensitive recording medium) between the cartridge reel 11a and the take-up reel 23. Exposure unit 64 controls halogen lamp 5a (i.e., turns lamp 5a on and off). Accordingly, exposure unit 64 and the elements which it controls (e.g., lamp 5a) function as exposing means for exposing the photosensitive recording medium to form an image thereon. Original support stand driver unit 65 controls the original support stand glass 2 to move back and forth. Optical system unit 66 controls lens 7 and mirrors 8,9 so that they are located in a suitable position. Filter driver unit 67 controls filter 6 so that it is located in a suitable position.

The CPU 50a is further connected to a ROM (read-only memory) 50b and a RAM (random-access memory) 50c. The RAM 50c acts as a work area for performing various types of processing and also stores data temporarily. ROM 50b stores various types of processing programs and stores initial data. CPU 50a operates to control the present image forming apparatus, according to a control program stored in ROM 50b, while utilizing the temporary data storage function of RAM 50c.

The arrangement as described above is operated as described below. When a start key 61a in the control panel 61 is pressed, the stand glass 2 is moved rightward in FIG. 1 and brought to a stop at a position where the left end of the glass 2 is to be lighted by halogen lamp 5a. Then, the halogen lamp 5a is turned on, and the light emitted from the lamp 5a is reflected by the original 4 supported on the glass stand 2 and transmitted through the filter 6, the lens system 7 and the reflection mirrors 8, 9 to form a latent image on the microcapsule sheet 11.

With the leftward movement of the stand glass 2, the developer sheet 33 is picked up by the sheet feed mechanism 32 from the developer sheet cassette 31 and is laid upon the exposed part of the microcapsule sheet 11 to be fed to the pressure developing unit 22. The microcapsule sheet 11 and the developer sheet 33 are sandwiched and pressed together between the pressure developing rollers 22a, 22b.

The microcapsule sheet 11 and the developer sheet 33 which have exited the pressure developing unit 22 are fed by the rollers 21c. Then, microcapsule sheet 11 is separated from the developer sheet 33 by the separator roll 21d. The microcapsule sheet 11 is directed upwardly, whereas the developer sheet 33 travels ahead into the thermal fixing unit 35.

Figure 4:
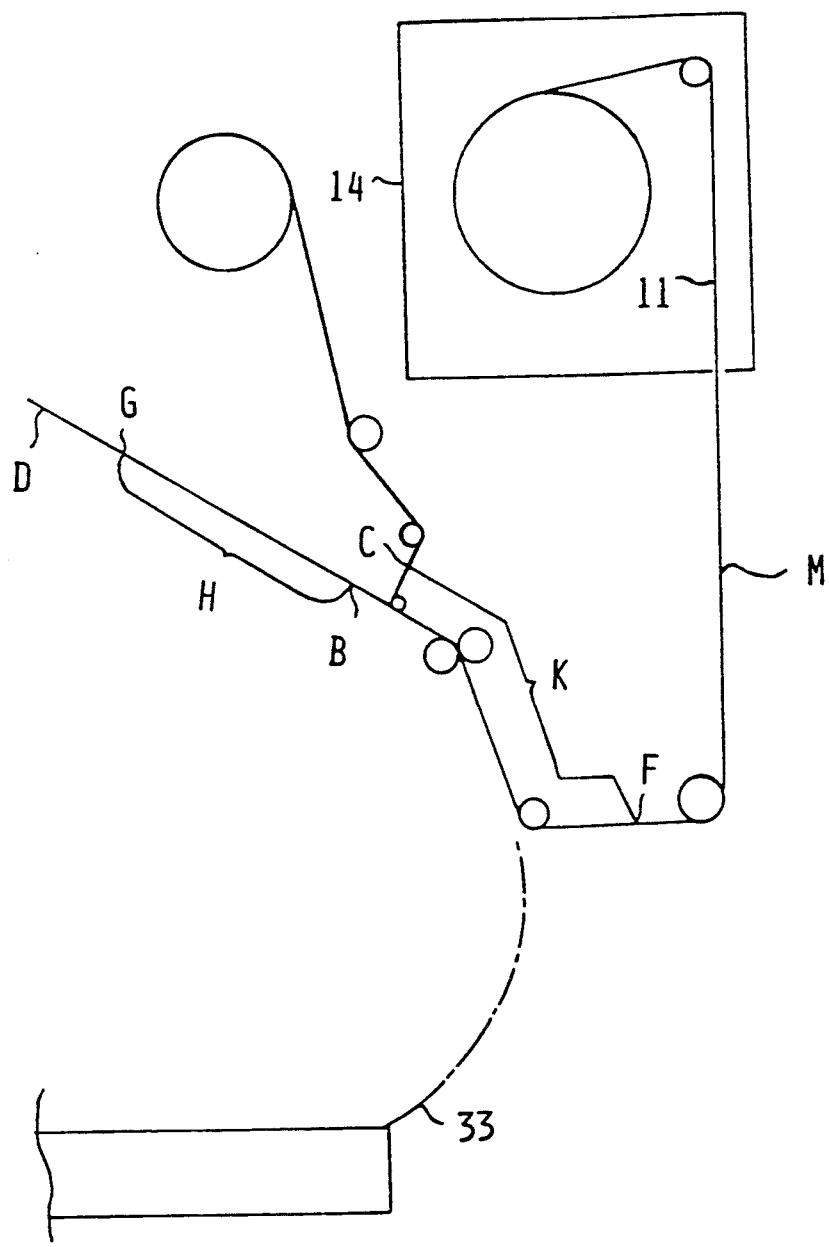
FIG. 4 is a view showing a feeding path of a photosensitive pressure sensitive recording sheet and the length prescribed between predetermined positions along the feeding path.

After color development on the developer sheet 33 is fixed by the thermal fixing unit 35, the developer sheet 33 is discharged into a tray 36 with the developed image facing up. The separated microcapsule sheet 11 travels past the adjustment roller 21e and is wound around the take-up reel 23. In this case, the trailing edge of the exposed area of the microcapsule sheet 11 superposed with the developer sheet 33 passes through the separator roller 21d for a perfect separation from the developer sheet and stops at a position C which is controlled to be spaced apart a short distance from the separator roller 21d along a microcapsule feeding path M, as shown in FIGS. 1 and 4. Therefore, the leading edge of the unused (unexposed) portion following the used (exposed) portion of the microcapsule sheet 11 is positioned at the position C described above. The trailing edge of developer sheet 33 is placed at the position B located at the left side of said separating roller 21.

If the next copying operation is to be performed in the above mentioned situation, an unexposed portion of the microcapsule sheet 11 located between the rear edge of the portion exposed in the preceding copying operation (located at position C) and the leading edge of the portion to be exposed in the next copying operation (located at the exposure position—point F) is wasted. In order to prevent this waste of the microcapsule sheet 11, the controller 50 controls the microcapsule sheet feeding portion 63B in the sheet feeding unit 63 so that the leading edge of the unexposed portion of the microcapsule sheet 11 is fed from the position C to the exposure table 10 (to be more precise, to exposure position F) through the separator roller 21d and the pressure developing unit 22 along the microcapsule sheet feeding path at a controlled speed. The controller 50 also controls developer sheet feeding portion 63A in the sheet feeding unit 63 so that the trailing end of developer sheet 33 is fed from the position B described above to the tray 36 at a controlled speed.

The controller 50 controls the developer feeding portion 63A and the microcapsule sheet feeding portion 63B so that the time required to feed the trailing end of developer sheet 33 from the position B to the tray 36 is not shorter than (is greater than or equal to) the time required to feed the leading edge of the unexposed portion of microcapsule sheet 11 from the position C to the exposure table 10 (position F) through the separating roller 21d and the developing unit 22. More specifically, as shown in FIG. 4, when the exposing operation of the preceding copying operation is finished, the trailing edge of the exposed portion, and thus the leading edge of the unexposed portion of the microcapsule sheet 11 is placed at a leading position (or exposure position) F of the exposure area located at the lower surface of the exposure table 10.

When the developing operation of the preceding copying operation is finished, the rear edge of the developer sheet 33 is placed at a position B controlled to be spaced a short distance from the separator roller 21d on the right side of the thermal fixing unit 35 along a developer sheet feeding path D. When the fixing operation of the copying operation is finished (and thus, the copying operation is finished), the rear edge of the developer sheet 33 is placed at a position G (located in discharge tray 36) controlled to be spaced a short distance from the outlet of the thermal fixing unit 35 along the developer sheet feeding path D. The length H is defined as a length of the feeding path D between the position G and the position B.

When the feeding operation from the position C to the exposure position F is ended, the leading edge of the next portion of the microcapsule sheet 11 to be exposed is placed at position F controlled to be adjacent the rear edge of the exposure area disposed at the lower surface of the exposure table 10. The length K is defined as a length of the feeding path M between the position C and the position F.

Prior to manufacturing the present copying machine, determinations are made as to the different speeds at which developer sheets 33 are fed from the position B to the position G through the thermal fixing unit 35 which speed differs depending on the type of material used to make the developer sheet (e.g., paper base material or polyethylterephalate PET material). Optimum data V relating to each of these feeding speeds of the developer sheet 33 was thus acquired.

Accordingly, the time of feeding of the developer sheet 33 from the position B to the position G was determined based on the length H and data V according to a formula (1) described below:

$$T = H/V. \qquad (1)$$

As a result, the speed required for feeding of the microcapsule sheet 11 from the position C to the position F so that the leading edge of the unexposed portion of the microcapsule sheet reaches position F prior to the trailing edge of the developer sheet reaches point G was determined based upon the calculated time T and the distance K according to formula (2) described below:

$$S = K/T. \qquad (2)$$

Thus, the data relating the appropriate calculated speed S to a corresponding optimum speed V can be stored in the ROM 50b.

A CPU 50a controls the developer sheet feeding portion 63A based on stored data to feed a developer sheet 33 from the position B to the position G at the speed V (based on the type of developer sheet being used) and further controls the microcapsule sheet feeding portion 63B based on stored data to feed microcapsule sheet 11 from the position C to the position F at the speed S so that the time required to feed the leading edge of the unexposed portion of microcapsule sheet 11 from the position C to the position F through the separator roller 21d and the developing unit 22 is substantially equal to the time required to feed the trailing edge of developer sheet 33 from the position B adjacent to the separator roller 21d to the position G.

Thus, controller 50, including main CPU 50a, functions as a controlling means for controlling the developer recording medium feeding means (e.g., portion 63A) and the photosensitive recording medium feeding means (e.g., portion 63B which includes driving source 63B1) to feed the developer sheets 33 from cassette 31 to tray 36, and to feed microcapsule sheet 11 between cartridge reel 11a and take-up reel 23. Moreover, the controlling means controls the developer recording medium feeding means and the photosensitive recording medium feeding means so that a time required to feed the developer recording medium from a position just downstream of the separating means to the discharge tray 36 along a developer medium feeding path is at least as long as a time required to feed the microcapsule sheet 11 from the position downstream of the separating means to exposure position F through the developing means along a photosensitive recording medium feeding path.

As described in the above embodiment, an image recording apparatus for recording an image on a microcapsule sheet 11 is disclosed. The image recording apparatus employs a recording medium comprising an elongated continuous form microcapsule sheet 11 capable of receiving a latent image to be formed, and a cut sheet type of developer medium 33 which provides an output image upon reaction with the latent image from the microcapsule sheet. The image recording apparatus comprises an exposing device having an exposure table 10 for exposing the elongated continuous form microcapsule sheet 11 to be fed along the sheet feeding path M, to form a latent image thereon, a developing device 22 disposed downstream of the exposing device with respect to the sheet path M for developing the exposed microcapsule sheet 11 superposed with the developer sheet 33, and a separating device 21d disposed downstream of the developing device 11 with respect to the sheet feeding path M for separating the exposed microcapsule sheet 11 from the developer sheet 33. Devices for feeding the sheets through the imaging machine include a developer sheet feeding device 63A for feeding a developer sheet 11 from a stored position to a discharged position through the developing device 22 and the separating device 21d along the sheet feeding path D, and a microcapsule sheet feeding device 63B for feeding the microcapsule sheet 11 from a separating device 21d to the exposure table 10 through the separating device 21d and the developing device 22 along the sheet feeding path M, wherein the controller 50 controls the developer feeding device 63A and the microcapsule sheet feeding device 63B so that the time required to feed the trailing edge of a developer sheet 33 from the position B adjacent the separating device 21d to the discharged position G in discharge tray 36 along the sheet feeding path D is not shorter than the time required to feed the leading edge of the unexposed portion of microcapsule sheet 11 from the position C adjacent to separating device 21d to the exposure position F through the separating device 21d and the developing device 22 along the sheet feeding path M. As a result, the developer sheet 33 is fed to the discharge tray 36 from a position adjacent the separating roller 21d along the sheet feeding path D by the developer sheet feeding portion 63A no sooner than the microcapsule sheet 11 is fed from a location adjacent separating device 21d to the exposure table 10 through the separating device 21d and the developing device 22 along the sheet feeding path M by the microcapsule sheet feeding portion 63B.

Therefore a user does not need wait for a time period for the proper positioning of the leading unexposed edge of the microcapsule sheet once he determines that the end of the preceding recording operation has occurred by viewing the developer sheet having a desired image output at the tray. Instead, he can proceed with the next recording operation at this time.

As an alternative embodiment, the exposing means can be constructed so that an original supported by the supporting stand glass is not movable back and forth and the light source is held at a predetermined position, but instead may be constructed so that the light source is movable back and forth, and an original supported by the supporting stand glass is held at a predetermined position.

Furthermore, the present invention is usable with an image recording device which uses a single sheet type of image recording medium, such as disclosed in U.S. Pat. No. 4,801,976. In such a device, the output image sheet which contains the developed image is a portion of the same sheet which contains the photosensitive recording material, which portion is exposed, developed, and separated from the unexposed portion of the photosensitive sheet by, for example, cutting. This differs somewhat from the two sheet type of image recording medium illustrated in the present specification where the output image sheet is a developer sheet, separate from the photosensitive sheet. Accordingly, the portion of the image recording apparatus which feeds the developer sheet downstream of the developing unit can also be characterized as means for feeding an output image sheet, because the developer sheet contains an output image when it is downstream of the developing unit. However, all of the above described advantages and objects are achieved when the present invention is applied to a machine which uses the single sheet type of recording medium as opposed to a machine which uses the two sheet type of recording medium.

While this invention has been described in conjunction with specific embodiments thereof, it is evident that many alternative modifications and variations will be apparent to those skilled in the art. Accordingly, the preferred embodiments of the invention as set forth herein are intended to be illustrative, not limiting. Various changes may be made without departing from the spirit and scope of the invention as defined in the following claims.

What is claimed is:

1. An image recording apparatus for recording an image on a recording medium, said apparatus having a recording medium feeding path and comprising:

a recording medium including an elongated continuous form photosensitive recording medium capable of receiving a n image to be formed, and a cut sheet type of a developer recording medium which provides an output image upon reaction with the photosensitive recording medium;

exposing means for exposing the elongated continuous form photosensitive recording medium fed along a photosensitive recording medium feeding path to a light image, said exposing means having an exposure position whereat a leading edge of an unexposed portion of said photosensitive recording medium is located prior to being exposed to the light image;

developing means, disposed downstream of said exposing means with respect to said photosensitive recording medium feeding path, for developing the exposed photosensitive recording medium superposed with the developer recording medium;

separating means, disposed downstream of said developing means with respect to said photosensitive recording medium feeding path, for separating the exposed photosensitive recording medium from the developer recording medium;

developer recording medium feeding means for feeding the developer recording medium from an upstream side of the developing means to a discharged position whereat said developer recording medium is discharged out of said image recording apparatus after being fed through said developing means and said separating means along a developer medium feeding path;

photosensitive recording medium feeding means for feeding a leading edge of an unexposed portion of said photosensitive recording medium from a position downstream of said separating means to said exposure position through the developing means along said photosensitive recording medium feeding path; and controlling means for controlling said developer recording medium feeding means and said photosensitive recording medium feeding means so that a time required to feed the developer recording medium from a position just downstream of said separating means to said discharged position along said developer medium feeding path is at least as long as a time required to feed said leading edge of said unexposed portion of said photosensitive recording medium from said position downstream of said separating means to said exposure position through the developing means along said photosensitive recording medium feeding path.

2. The image recording apparatus as defined in claim 1, wherein a length of the developer medium feeding path from said position just downstream of said separating means to said discharged position along said developer medium feeding path is measured, and the time required to feed said developer recording medium from said position just downstream of said separating means to said discharged position is calculated based on said measured length of said developer medium feeding path and at least one speed at which the developer medium is fed through said measured length for a selected type of developer medium.

3. The image recording apparatus as defined in claim 2, wherein the speed at which the developer medium is fed is determined for a variety of different types of developer medium.

4. The image recording apparatus as defined in claim 3, wherein the length of the photosensitive recording medium feeding path from said position downstream of said separating means to said exposure position is measured, and the speed at which the photosensitive recording medium is fed from said position downstream of said separating means to said exposure position is calculated based on said measured length of said photosensitive recording medium feeding path and the time required to feed said developer medium from said position downstream of said separating means to said discharged position.

5. An image recording apparatus having a recording medium feeding path and comprising:

a recording medium including an elongated continuous form photosensitive recording medium capable of receiving an image to be formed, and a cut sheet type of a developer recording medium which provides an output image upon reaction with the photosensitive recording medium;

exposing means for exposing said elongated continuous form photosensitive recording medium fed along a photosensitive recording medium feeding path to a light image, said exposing means having an exposure position at which a leading edge of a portion of the photosensitive recording medium is located prior to exposure thereof to the light image;

developing means, disposed downstream of said exposing means with respect to said photosensitive recording medium feeding path, for developing said exposed photosensitive recording medium superposed with said developer recording medium;

separating means, disposed downstream of said developing means with respect to said photosensitive recording medium feeding path, for separating said exposed photosensitive recording medium from said developer recording medium;

developer recording medium feeding means for feeding the developer recording medium from an upstream side of said developing means to a discharged position whereat said developer recording medium is discharged out of said image recording apparatus through said developing means and the separating means along a developer recording medium feeding path;

photosensitive recording medium feeding means for feeding said photosensitive recording medium from an upstream side of said exposing means to a downstream side of said separating means through said developing means and said separating means along said photosensitive recording medium feeding path and for feeding a leading edge of an unexposed portion of said photosensitive recording medium from said downstream side of said separating means to said exposure position through said separating means and said developing means along said photosensitive recording medium feeding path; and controlling means for controlling said developer recording medium feeding means and said second photosensitive recording medium feeding means so that a time required to feed a trailing edge of said developer recording medium from said downstream side of said separating means to said discharged position along said developer recording medium feeding path is at least as long as a time required to feed said leading edge of said unexposed portion of said photosensitive recording medium from said downstream side of said separating means to said exposure position through said separating means and said developing means along said photosensitive recording medium feeding path.

6. The image recording apparatus as defined in claim 5, wherein a length of said developer recording medium feeding path from said downstream side of said separating means to said discharged position along said developer recording medium feeding path is measured, and the time required to feed said developer recording medium from said downstream side of said separating means to said discharged position is calculated based on said measured length of said developer medium feeding path and at least one speed at which the developer medium is fed through said measured length for a selected type of developer medium.

7. The image recording apparatus as defined in claim 6, wherein the speed at which the developer medium is fed is determined for a variety of different types of developer medium.

8. The image recording apparatus as defined in claim 7, wherein the length of said photosensitive recording medium feeding path from said downstream side of said separating means to said exposure position is measured, and the speed at which said photosensitive recording medium is fed from said downstream side of said separating means to said exposure position is calculated based on said measured length of said photosensitive recording medium feeding path and the time required to feed said developer medium from said downstream side of said separating means to said discharged position.

9. An image recording apparatus for recording images on a continuous form photosensitive recording medium which is supplied in a cartridge and fed along a feed path, the apparatus comprising:

means for receiving a cartridge of continuous form photosensitive recording medium;

exposing means for exposing photosensitive recording medium fed along the feed path to a light image, said exposing means having an exposure position at which a leading edge of a portion of a photosensitive recording medium is located prior to being exposed to the light image;

developing means, disposed downstream of said exposing means along the feed path, for developing an exposed portion of the photosensitive recording medium to form an output image sheet;

separating means for separating the output image sheet from the photosensitive recording medium, said separating means being located downstream of said developing means along said feed path;

means for feeding the output image sheet from a position just downstream of said separating means to a discharged position where the output image sheet is discharged out of said image recording apparatus;

means for feeding a leading edge of an unexposed portion of the photosensitive recording medium from a position downstream of said separating means to said exposure position; and means for controlling said means for feeding the output image sheet and said means for feeding the photosensitive recording medium so that a time required to feed a trailing edge of the output image sheet from said position just downstream of said separating means to said discharged position is at least as long as a time required to feed said leading edge of said unexposed portion of the photosensitive recording medium from said position downstream of said separating means to said exposure position.

10. The image recording apparatus as defined in claim 9, further comprising:

thermal fixing means for thermally fixing the output image to said output image sheet, said thermal fixing means being located between said separating means and said discharged position.

11. The image recording apparatus as defined in claim 10, wherein selectively operable different speeds of said output image sheet through said thermal fixing means are based upon the type of output image sheet being used, and said means for controlling selects the different speeds at which said means for feeding the output image sheet and said means for feeding the photosensitive recording medium feed based upon the type of output image sheet being used.

12. The image recording apparatus as defined in claim 9, wherein said means for feeding the leading edge of the unexposed portion of the photosensitive recording medium also feeds said photosensitive recording medium from said exposure position to said position downstream of said separating means during imaging and development thereof.

* * * * *